(12) United States Patent
Shen et al.

(10) Patent No.: US 10,191,122 B2
(45) Date of Patent: Jan. 29, 2019

(54) PARAMETER IDENTIFICATION CIRCUIT, METHOD AND POWER SUPPLY SYSTEM APPLYING THE SAME

(71) Applicant: Silergy Semiconductor Technology (Hangzhou) LTD, Hangzhou, ZheJiang Province (CN)

(72) Inventors: Zhiyuan Shen, Zhejiang Province (CN); Chen Zhao, Zhejiang Province (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 4 days.

(21) Appl. No.: 15/698,870

(22) Filed: Sep. 8, 2017

(65) Prior Publication Data
US 2018/0088183 A1  Mar. 29, 2018

(30) Foreign Application Priority Data
Sep. 23, 2016 (CN) .......................... 2016 1 0847952

(51) Int. Cl.
| | |
|---|---|
| H02M 3/156 | (2006.01) |
| G01R 31/40 | (2014.01) |
| H02M 1/08 | (2006.01) |
| H02M 3/157 | (2006.01) |
| H02M 3/158 | (2006.01) |
| H02M 1/36 | (2007.01) |
| H02M 1/00 | (2006.01) |

(52) U.S. Cl.
CPC .............. *G01R 31/40* (2013.01); *H02M 1/08* (2013.01); *H02M 3/157* (2013.01); *H02M 3/158* (2013.01); *H02M 1/36* (2013.01); *H02M 2001/0009* (2013.01)

(58) Field of Classification Search
CPC .... H02M 3/156–3/158; H02M 3/1584; H02M 3/1588; H02M 1/08; H02M 1/36; H02M 2001/009; Y02B 70/1466; G01R 31/40
USPC .................................................. 323/271–285
See application file for complete search history.

(56) References Cited

U.S. PATENT DOCUMENTS

| | | |
|---|---|---|
| 7,989,986 B2 | 8/2011 | Baarman et al. |
| 9,385,599 B2 * | 7/2016 | Congiu ................. H02M 3/157 |

(Continued)

*Primary Examiner* — Yemane Mehari
(74) *Attorney, Agent, or Firm* — Michael C. Stephens, Jr.

(57) ABSTRACT

A parameter identification circuit for a digital power converter having an inductor and a capacitor, can include: an inductor parameter circuit that receives an inductor current of the inductor, a capacitor voltage of the capacitor, a duty cycle in a start-up stage, and a predetermined inductor current, where the inductor parameter circuit obtains an inductor parameter according to an integrated value of the capacitor voltage, an integrated value of the duty cycle in the start-up stage, and the predetermined inductor current, when the inductor current rises to a level of the predetermined inductor current; and a capacitor parameter circuit that receives the inductor current, the capacitor voltage, and a predetermined capacitor voltage, where the capacitor parameter circuit obtains a capacitor parameter according to an integrated value of the inductor current and the predetermined capacitor voltage when the capacitor voltage rises to a level of the predetermined capacitor voltage.

12 Claims, 3 Drawing Sheets

(56) References Cited

U.S. PATENT DOCUMENTS

2012/0080944 A1\* 4/2012 Recker ............... H02J 9/02
307/25
2014/0333288 A1\* 11/2014 Liao ............... G01R 21/133
324/120

\* cited by examiner

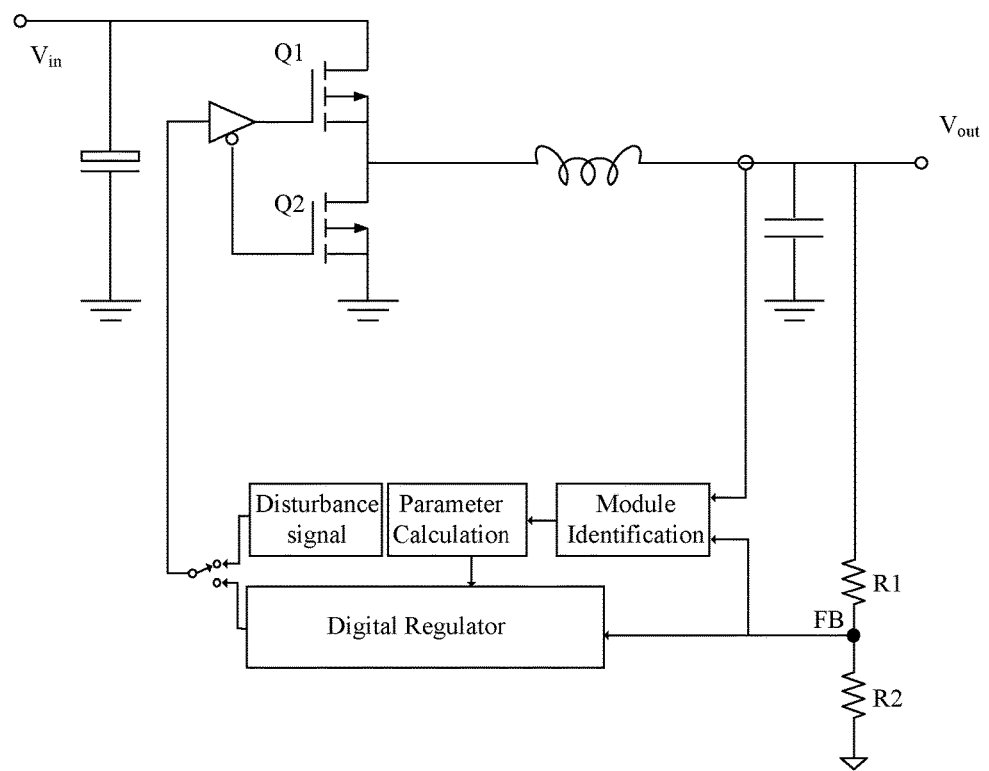
FIG. 1 (conventional)

PARAMETER IDENTIFICATION CIRCUIT, METHOD AND POWER SUPPLY SYSTEM APPLYING THE SAME

RELATED APPLICATIONS

This application claims the benefit of Chinese Patent Application No. 201610847952.6, filed on Sep. 23, 2016, which is incorporated herein by reference in its entirety.

FIELD OF THE INVENTION

The present invention generally relates to the field of power electronics, and more particularly to parameter identification circuitry, methods, and associated power supply systems.

BACKGROUND

As shown in FIG. 1, parameter identification for a digital power converter may operate in a condition whereby the power converter is in an open-loop. By inputting the disturbance signal, collecting the inductance value, capacitance value, and an output voltage, the module parameters of the digital regulator can be obtained through a certain algorithm. However, because the power converter operates in an open-loop state, it may be unable to output a stable voltage that satisfies load requirements during the parameter identification process.

BRIEF DESCRIPTION OF THE DRAWINGS

FIG. 1 is a schematic block diagram of an example digital power converter.

DETAILED DESCRIPTION

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

Digital-controlled power converters facilitate configuring the parameters of control circuits according to the parameters of the inductor and capacitor of the power converter. In particular embodiments, parameter identification can identify inductor and capacitor parameters during a start-up state of the system without introducing any disturbance signals. This is in contrast to performing parameter identification when the system is in the stable state whereby the power converter operates in an open-loop mode to provide a stable output voltage for subsequent circuitry. In addition, particular embodiments can adaptively generate parameters for digital regulators with different inductor and capacitor parameters, such that the system can set the cut-off frequency, the phase margin, and the amplitude margin.

In one embodiment, a parameter identification circuit for a digital power converter having an inductor and a capacitor, can include: (i) an inductor parameter circuit configured to receive an inductor current of the inductor, a capacitor voltage of the capacitor, a duty cycle in a start-up stage, and a predetermined inductor current, where the inductor parameter circuit is configured to obtain an inductor parameter according to an integrated value of the capacitor voltage, an integrated value of the duty cycle in the start-up stage, and the predetermined inductor current, when the inductor current rises to a level of the predetermined inductor current; and (ii) a capacitor parameter circuit configured to receive the inductor current, the capacitor voltage, and a predetermined capacitor voltage, where the capacitor parameter circuit is configured to obtain a capacitor parameter according to an integrated value of the inductor current and the predetermined capacitor voltage when the capacitor voltage rises to a level of the predetermined capacitor voltage.

Figure 2:
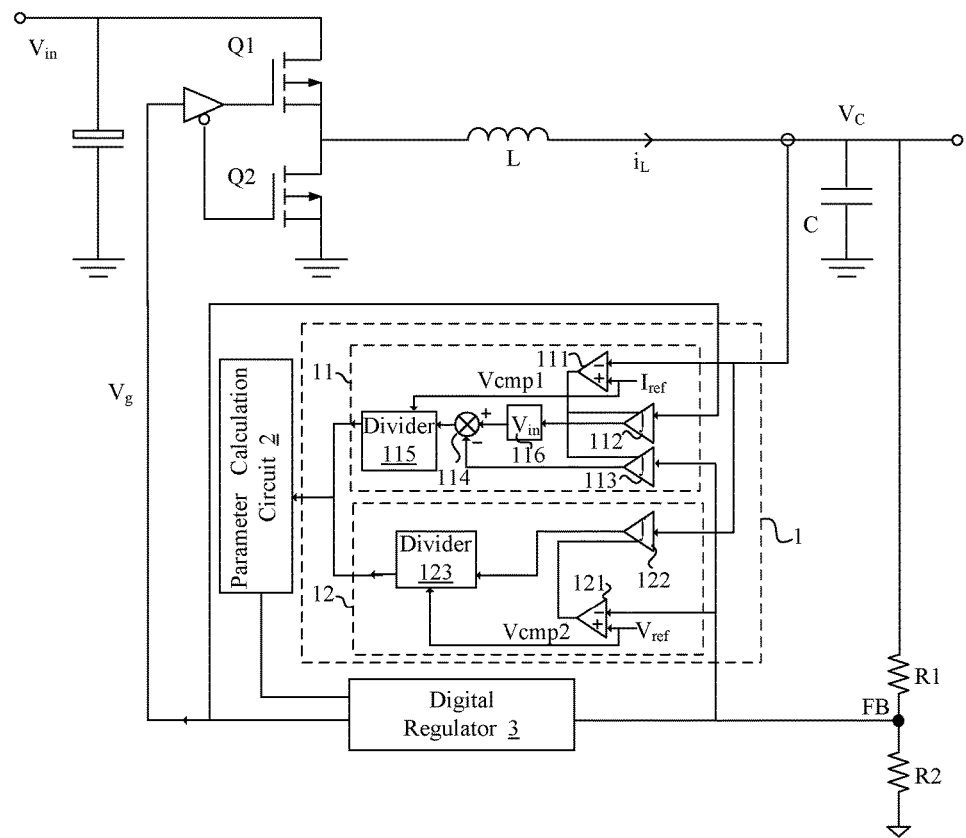
FIG. 2 is a schematic block diagram of an example parameter identification circuit, in accordance with embodiments of the present invention.

Referring now to FIG. 2, shown is a schematic block diagram of an example parameter identification circuit, in accordance with embodiments of the present invention. In this example, the parameter identification circuit may be applied in a digital power converter, which can include a power stage circuit and a control circuit. In this particular example, the power stage circuit may have a Buck topology, which can include inductor L, capacitor C, and switches Q1 and Q2. The control circuit can include parameter identification circuit 1, parameter identification circuit, 2 and digital regulator 3.

Parameter identification circuit 1 can obtain an inductor parameter (e.g., an inductance value) of inductor L, and a capacitor parameter (e.g., a capacitance value) of capacitor C in the power stage circuit. Parameter calculation circuit 2 can calculate the parameters of the model in digital regulator 3 according to the inductor parameter and the capacitor parameter. Digital regulator 3 can generate control signals for switches Q1 and Q2 according to the parameters calculated by parameter calculation circuit 2, such that the output voltage of the power converter can satisfy various application requirements.

Parameter identification circuit 1 can include inductor parameter circuit 11 and capacitor parameter circuit 12. Parameter identification circuit 1 can calculate capacitance value C and inductance value L according to a capacitor voltage, an inductor current, and duty cycle (e.g., of the switching regulator) in a start-up stage. The subsequent circuit can calculate the conjugate pole frequency of the power converter according to capacitance value C and inductance value L. Thus, the digital regulator can adaptively generate parameters under the conditions of different inductor and capacitor parameters, such that the system can set the cut-off frequency, the phase margin, and the amplitude margin.

For example, the inductor parameter can be calculated based on the following formula (1):

$$L = \frac{\int_0^t D \cdot V_{in} dt - \int_0^t V_C dt}{I_{ref}} \quad (1)$$

Predetermined inductor current $I_{ref}$ can be set as smaller than a maximum current value that the power converter can withstand.

In one embodiment, a method of identifying parameters of a digital power converter having an inductor and a capacitor, can include: (i) setting a predetermined inductor current and a predetermined capacitor voltage; (ii) obtaining an inductor current of the inductor, a capacitor voltage of the capacitor, and a duty cycle in a start-up stage of the digital power converter; (iii) obtaining an inductor parameter according to an integrated value of the capacitor voltage, an integrated value of the duty cycle in the start-up stage, and the predetermined inductor current, when the inductor current rises to a level of the predetermined inductor current; and (iv) obtaining a capacitor parameter according to an integrated value of the inductor current and the predetermined capacitor voltage when the capacitor voltage rises to a level of the predetermined capacitor voltage.

Figure 3:
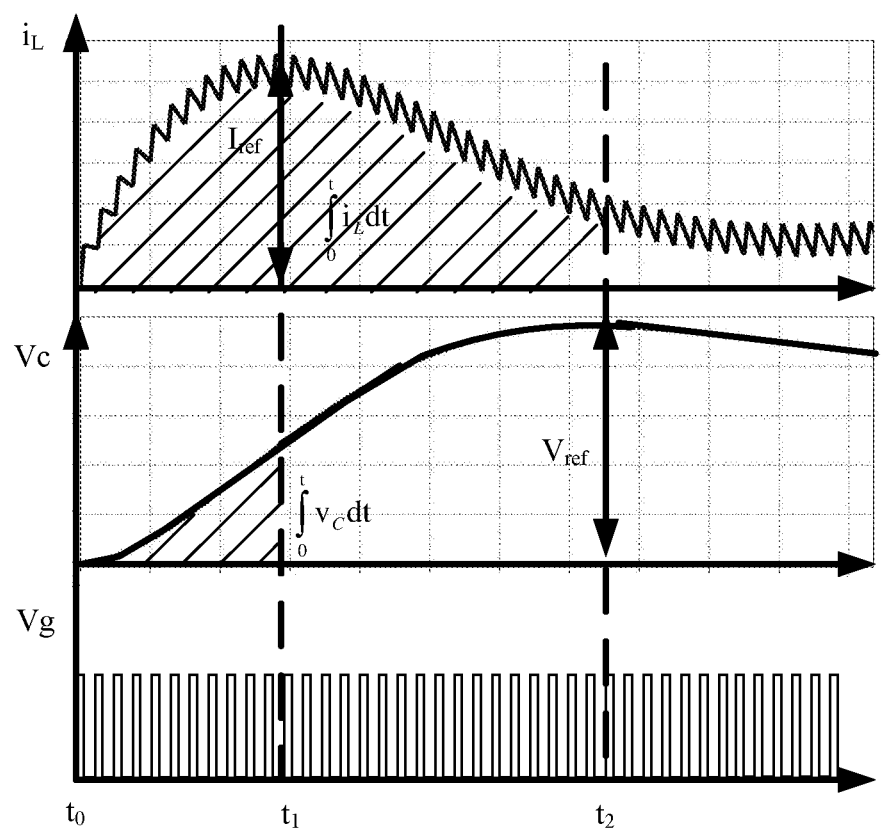
FIG. 3 is a waveform diagram of example operation of a parameter identification circuit, in accordance with embodiments of the present invention.

Referring now to FIG. 3, shown is a waveform diagram of example operation of a parameter identification circuit, in accordance with embodiments of the present invention. At time $t_0$, the power converter may initiate a soft start-up stage, and capacitor voltage $V_C$ and duty cycle D in the start-up stage may be integrated. At time $t_1$, when inductor current $i_L$ reaches a level of predetermined inductor current $I_{ref}$, the integrating operation is completed. Then, a product value may be obtained by multiplying the integrated value of the duty cycle in the start-up stage by input voltage $V_{in}$. A difference value can be obtained by subtracting the integrated value of the capacitor voltage from the product value. Inductance value L can be obtained by dividing the difference value by predetermined inductor current $I_{ref}$.

Referring also to FIG. 2, inductor parameter circuit 11 can receive inductor current $i_L$ of inductor L, capacitor voltage $V_C$ of the capacitor, the duty cycle in the start-up stage, and predetermined inductor current $I_{ref}$. When inductor current $i_L$ reaches a level of predetermined inductor current $I_{ref}$, the inductor parameter can be obtained according to the integrated value of the capacitor voltage, the integrated value of the duty cycle in the start-up stage, and predetermined inductor current $I_{ref}$.

Inductor parameter circuit 11 can include comparator 111 that receives inductor current $i_L$ and predetermined inductor current $I_{ref}$, and may generate comparison signal Vcmp1. Inductor current $i_L$ may be a real/direct inductor current, or a sampling value that represents the inductor current. In this particular example, comparator 111 may have a non-inverting input terminal that receives predetermined inductor current $I_{ref}$, and an inverting input terminal that receives inductor current $i_L$. When inductor current $i_L$ is smaller/less than predetermined inductor current $I_{ref}$, comparison signal Vcmp1 can be high. When inductor current $i_L$ reaches a level of predetermined inductor current $I_{ref}$, comparison signal Vcmp1 can go low.

Integrator 112 can receive comparison signal Vcmp1 and duty cycle D in the start-up stage, and may perform an integrating operation on duty cycle D in the start-up stage when comparison signal Vcmp1 is at high level. When inductor current $i_L$ is smaller than predetermined inductor current $I_{ref}$, the integrated value of duty cycle D in the start-up stage can be provided when comparison signal Vcmp1 goes low. Gain circuit 116 can be provided for multiplying the integrated value of duty cycle D in the start-up stage by input voltage $V_{in}$. Integrator 113 can receive comparison signal Vcmp1 and capacitor voltage $V_C$, and may perform an integrating operation on capacitor voltage $V_C$ when comparison signal Vcmp1 is high. When inductor current $i_L$ is smaller/less than predetermined inductor current $I_{ref}$, the integrated value of the capacitor voltage may be provided when comparison signal Vcmp1 goes low.

Adder 114 can receive a product value of the integrated value of the duty cycle in the start-up stage and the input voltage, and the integrated value of the capacitor voltage, and may generate a difference value of the product value and the integrated value of the capacitor voltage by adding the product value with a negated value of the integrated value of the capacitor voltage. Divider 115 can receive the difference value of the product value and the integrated value of the capacitor voltage, and predetermined inductor current $I_{ref}$, and may generate inductor parameter L by performing a division operation on the difference value and inductor current $I_{ref}$.

For example, the capacitor parameter can be calculated based on the following formula (2):

$$C = \frac{\int_0^t i_L dt}{V_{ref}} \quad (2)$$

Predetermined capacitor voltage $V_{ref}$, which may be smaller than the under voltage lock out (UVLO) voltage of the subsequent circuit, can be set in advance. In addition, the subsequent circuit may be considered as no-load. As shown in FIG. 3, at time $t_0$, the power converter can initiate a soft start-up stage, and inductor current $i_L$ may be integrated. At time $t_2$, when capacitor voltage $V_C$ reaches a level of predetermined capacitor voltage $V_{ref}$, the integrating operation is completed. The integrated value of inductor current $i_L$ may be divided by predetermined capacitor voltage $V_{ref}$, in order to obtain capacitance value C.

Capacitor parameter circuit 12 can receive inductor current $i_L$, capacitor voltage $V_C$, and predetermined capacitor voltage $V_{ref}$. When capacitor voltage $V_C$ rises to a level of predetermined capacitor voltage $V_{ref}$, capacitor parameter C can be obtained according to the integrated value of the inductor current and predetermined capacitor voltage $V_{ref}$. Capacitor parameter circuit 12 can include comparator 121 that receives capacitor voltage $V_C$ and predetermined capacitor voltage $V_{ref}$, and may generate comparison signal Vcmp2. Similarly, capacitor voltage $V_C$ may be a real/direct capacitor voltage, or a sampling value that represents the capacitor voltage. In this particular example, comparator 121 may have a non-inverting input terminal that receives predetermined capacitor voltage $V_{ref}$, and an inverting input terminal that receives capacitor voltage $V_C$. When capacitor voltage $V_C$ is smaller/less than predetermined capacitor voltage $V_{ref}$, comparison signal Vcmp2 can be high. When capacitor voltage $V_C$ reaches a level of predetermined capacitor voltage $V_{ref}$, comparison signal Vcmp2 can go low.

Integrator 122 can receive comparison signal Vcmp2 and inductor current $i_L$, and may perform an integrating operation on inductor current $i_L$ when comparison signal Vcmp2 is high. When capacitor voltage $V_C$ is smaller/less than predetermined capacitor voltage $V_{ref}$, an integrated value of inductor current $i_L$ can be provided when comparison signal Vcmp2 goes low. Divider 123 can receive the integrated value of the inductor current and predetermined capacitor voltage $V_{ref}$, and may generate capacitor parameter C by performing a division operation on the integrated value of the inductor current and predetermined capacitor voltage $V_{ref}$.

In particular embodiments, inductor and capacitor parameters can be identified during the start-up of the system, instead of in a stable operation state. Thus, the power converter needing to operate in an open-loop mode and providing a required output voltage for a subsequent circuit with signal injection while identifying such parameters can be substantially avoided. In addition, particular embodiments can adaptively generate parameters for digital regulators with different inductor and capacitor parameters. In this way, the system can satisfy requirements of setting the cut-off frequency, the phase margin, and the amplitude margin.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A parameter identification circuit for a digital power converter having an inductor and a capacitor, the parameter identification circuit comprising:
   a) an inductor parameter circuit configured to receive an inductor current of said inductor, a capacitor voltage of said capacitor, a duty cycle in a start-up stage, and a predetermined inductor current, wherein said inductor parameter circuit is configured to obtain an inductor parameter according to an integrated value of said capacitor voltage, an integrated value of said duty cycle in said start-up stage, and said predetermined inductor current, when said inductor current rises to a level of said predetermined inductor current;
   b) a capacitor parameter circuit configured to receive said inductor current, said capacitor voltage, and a predetermined capacitor voltage, wherein said capacitor parameter circuit is configured to obtain a capacitor parameter according to an integrated value of said inductor current and said predetermined capacitor voltage when said capacitor voltage rises to a level of said predetermined capacitor voltage; and
   c) wherein said inductor parameter circuit is configured to obtain a product value by multiplying said integrated value of said duty cycle in said start-up stage by an input voltage, and to obtain a difference value by subtracting said integrated value of said capacitor voltage from said product value, wherein said inductor parameter is obtained by dividing said difference value by said predetermined inductor current.

2. The parameter identification circuit of claim 1, wherein said inductor current, said capacitor voltage, and said duty cycle in said start-up stage are integrated when said digital power converter is enabled.

3. The parameter identification circuit of claim 1, wherein said inductor parameter circuit comprises:
   a) a first comparator configured to receive said inductor current and said predetermined inductor current, and to generate a first comparison signal;
   b) a first integrator configured to receive said first comparison signal and said duty cycle in said start-up stage, and to perform an integrating operation on said duty cycle in said start-up stage according to a level of said first comparison signal;
   c) a second integrator configured to receive said first comparison signal and said capacitor voltage, and to perform an integral action on said capacitor voltage according to said level of said first comparison signal;
   d) an adder configured to receive said product value of said integrated value of said duty cycle in said start-up stage and said input voltage, and said integrated value of said capacitor voltage, and to generate said difference value by performing a subtraction operation; and
   e) a divider configured to receive said difference value and said predetermined inductor current, and to generate said inductor parameter by performing a division operation.

4. The parameter identification circuit of claim 1, wherein said capacitor parameter comprises a quotient of said integrated value of said inductor current and said predetermined capacitor voltage.

5. The parameter identification circuit of claim 4, wherein said capacitor parameter circuit comprises:
   a) a second comparator configured to receive said capacitor voltage and said predetermined capacitor voltage, and to generate a second comparison signal;
   b) a third integrator configured to receive said second comparison signal and said inductor current, and to perform an integrating operation on said inductor current according to a level of said second comparison signal; and
   c) a divider configured to receive said integrated value of said inductor current and said predetermined capacitor voltage, and to generate said capacitor parameter by performing a division operation.

6. A power supply system, comprising the parameter identification circuit of claim 1, and further comprising:
   a) a power stage circuit;
   b) a digital regulator; and
   c) a parameter calculation circuit for calculating parameters of said digital regulator according to said inductor parameter and said capacitor parameter.

7. A method of identifying parameters of a digital power converter having an inductor and a capacitor, the method comprising:
   a) setting a predetermined inductor current and a predetermined capacitor voltage;
   b) obtaining an inductor current of said inductor, a capacitor voltage of said capacitor, and a duty cycle in a start-up stage of said digital power converter;
   c) obtaining an inductor parameter according to an integrated value of said capacitor voltage, an integrated value of said duty cycle in said start-up stage, and said predetermined inductor current, when said inductor current rises to a level of said predetermined inductor current;
   d) obtaining a capacitor parameter according to an integrated value of said inductor current and said predetermined capacitor voltage when said capacitor voltage rises to a level of said predetermined capacitor voltage;
   e) obtaining a product value by multiplying said integrated value of said duty cycle in said start-up stage by an input voltage;
   f) obtaining a difference value by subtracting said integrated value of said capacitor voltage from said product value; and
   g) generating said inductor parameter by dividing said difference value by said predetermined inductor current.

8. The method of claim 7, wherein said capacitor parameter comprises a quotient of said integrated value of said inductor current and said predetermined capacitor voltage.

9. A parameter identification circuit for a digital power converter having an inductor and a capacitor, the parameter identification circuit comprising:

a) an inductor parameter circuit configured to receive an inductor current of said inductor, a capacitor voltage of said capacitor, a duty cycle in a start-up stage, and a predetermined inductor current, wherein said inductor parameter circuit is configured to obtain an inductor parameter according to an integrated value of said capacitor voltage, an integrated value of said duty cycle in said start-up stage, and said predetermined inductor current, when said inductor current rises to a level of said predetermined inductor current;

b) a capacitor parameter circuit configured to receive said inductor current, said capacitor voltage, and a predetermined capacitor voltage, wherein said capacitor parameter circuit is configured to obtain a capacitor parameter according to an integrated value of said inductor current and said predetermined capacitor voltage when said capacitor voltage rises to a level of said predetermined capacitor voltage, wherein said capacitor parameter comprises a quotient of said integrated value of said inductor current and said predetermined capacitor voltage; and c) wherein said capacitor parameter circuit comprises a second comparator configured to receive said capacitor voltage and said predetermined capacitor voltage, and to generate a second comparison signal, a third integrator configured to receive said second comparison signal and said inductor current, and to perform an integrating operation on said inductor current according to a level of said second comparison signal, and a divider configured to receive said integrated value of said inductor current and said predetermined capacitor voltage, and to generate said capacitor parameter by performing a division operation.

10. The parameter identification circuit of claim 9, wherein said inductor current, said capacitor voltage, and said duty cycle in said start-up stage are integrated when said digital power converter is enabled.

11. The parameter identification circuit of claim 9, wherein said inductor parameter circuit comprises:

a) a first comparator configured to receive said inductor current and said predetermined inductor current, and to generate a first comparison signal;

b) a first integrator configured to receive said first comparison signal and said duty cycle in said start-up stage, and to perform an integrating operation on said duty cycle in said start-up stage according to a level of said first comparison signal;

c) a second integrator configured to receive said first comparison signal and said capacitor voltage, and to perform an integral action on said capacitor voltage according to said level of said first comparison signal;

d) an adder configured to receive said product value of said integrated value of said duty cycle in said start-up stage and said input voltage, and said integrated value of said capacitor voltage, and to generate said difference value by performing a subtraction operation; and e) a divider configured to receive said difference value and said predetermined inductor current, and to generate said inductor parameter by performing a division operation.

12. A power supply system, comprising the parameter identification circuit of claim 9, and further comprising:

a) a power stage circuit;
b) a digital regulator; and
c) a parameter calculation circuit for calculating parameters of said digital regulator according to said inductor parameter and said capacitor parameter.

* * * * *